United States Patent [19]

Bluzer

[11] 4,247,788

[45] Jan. 27, 1981

[54] CHARGE TRANSFER DEVICE WITH TRANSISTOR INPUT SIGNAL DIVIDER

[75] Inventor: Nathan Bluzer, Silver Spring, Md.

[73] Assignee: Westinghouse Electric Corp., Pittsburgh, Pa.

[21] Appl. No.: 953,809

[22] Filed: Oct. 23, 1978

[51] Int. Cl.³ .................. G11C 19/28; H01L 29/78; H01L 27/02; H01L 29/80

[52] U.S. Cl. .................. 307/221 D; 357/22; 357/24; 357/43; 357/55

[58] Field of Search .............. 357/24, 43; 307/221 D

[56] References Cited

U.S. PATENT DOCUMENTS

| | | | |
|---|---|---|---|
| 3,660,697 | 5/1972 | Berglund et al. | 357/24 |
| 4,124,862 | 11/1978 | Engeler et al. | 357/24 |
| 4,152,715 | 5/1979 | Wang | 357/24 |

FOREIGN PATENT DOCUMENTS 7506795 12/1976 Netherlands .................. 357/24

OTHER PUBLICATIONS

Chamberlain, "High Speed Scanner Photoelement with Gain", IBM Technical Disclosure Bulletin, vol. 19, (4/77), pp. 4458-4460.

*Primary Examiner*—Gene M. Munson
*Attorney, Agent, or Firm*—H. W. Patterson

[57] ABSTRACT

A charge coupled device that includes an input portion having an injection transistor and one or more partitioning transistors disposed in the potential well channel. The bases of the transistors are common. The collector of the injection transistor is common with the potential well channel. The total area of the base emitter junction of the partitioning transistor is larger in a certain predetermined relationship to the area of the base emitter junction of the injection transistor. An input signal of a larger than suitable value may be applied to the emitters and the current entering the collector of the injection transistor represents a predetermined fraction of the applied signal as a function of the relative areas of the base emitter junctions.

17 Claims, 18 Drawing Figures

CHARGE TRANSFER DEVICE WITH TRANSISTOR INPUT SIGNAL DIVIDER

The Government has rights in this invention pursuant to Contract No. N00173-78-C-0212 with the Department of the Navy.

CROSS-REFERENCE TO RELATED APPLICATIONS

Reference is made to Application bearing Ser. No. 953,808, entitled Charge Transfer Device Having an Improved Readout Portion, which is filed concurrently herewith and assigned to a common assignee, which application is directed to an improved charge transfer device having an improved output portion.

BACKGROUND OF THE INVENTION

Charge transfer devices may be thought of as having three functional portions; namely, a signal input portion, where a signal current is applied to the device for transforming such signal into a charge packet; a transfer portion, having a plurality of stages where the packet of charge or an accurate portion thereof is transferred from stage to stage; and a readout, output or sensing portion where the charge packet is converted to an electrical signal that is a representation of the charge packet. The operating frequency of charge transfer devices is usually limited by the operating speed of the input and output portions or structures.

Heretofore, several clocking operations or a single MOS transistor was utilized to meter the analog charge packets from the input portion into a transfer stage or potential well. The second clocking operations limited the maximum information bandwidth of the device over the bandwidth possible with an injection using a single operation. The use of an MOS single injection transistor, however, exhibits threshold non-uniformities and susceptibility to bandwidth reduction due to parasitic effects.

Inherently, charge transfer devices can accommodate only very low currents. Specifically, the current handling capability of a high-speed device is in the hundred microampere region; and generating such a low current level at high frequencies through high impedance lines is difficult and susceptible to induced noise currents by capacitance coupling and leakage currents enhanced by offset voltages. A higher level input signal applied to such input structure would exhibit better noise immunity than low level input signals. Such higher level input signals, however, are generally too great for charge transfer devices in that the potential wells become saturated with charge.

Thus, it is desirable to provide a signal input structure for a charge coupled device that enhances the input of high frequency signals and the signal to noise ratio of the input signal. The signal portion should involve only a single step without additional input clocking circuits in order to maximize the bandwidth of the input signal. Also, it is desirable that the input signal level be sufficiently high to provide better noise immunity and that the current level be sufficiently low for metering of charge packets for coupling or injection into the transfer or shift register portion. Further, the input structure should have a low input impedance so that it is less susceptible to bandwidth reduction by parasitic capacitances.

SUMMARY OF THE INVENTION

Broadly, in accordance with the present invention, an improved charge transfer device is provided having an input portion that is structured such that a distinct predetermined fraction of the signal input current is directed to the adjacent or first potential well of the device. In another broad aspect, the charge transfer device has a signal input portion that includes a bi-polar transistor where the channel in which the potential well or wells resides is the virtual collector of such input structure.

Specifically, the charge transfer device has an input portion that includes a first transistor with the option of at least one second transistor. The bases or gates of the first and second transistors are common. The collector or drain of the first transistor is structured to form a part of the potential well channel. For high speed operation and to provide noise immunity one or more second transistors are provided where the collector or drain of the second transistor or transistors, as the case may be, which is separated from the charge packet channel or collector of the second transistor, maybe connected to a DC source in common with the common bases. The input signal is applied to the commonly connected emitters of the first and second transitors. The total base emitter junction area of the first transistor is smaller than the total base emitter junction of the second transistor or transistors in proportion to the particular fraction of the input signal that is to be directed to the adjacent potential well.

DESCRIPTION OF THE PREFERRED EMBODIMENTS

In utilizing the term "charge transfer device," hereinafter referred to as CTD, it is meant to include chargecoupled devices, (CCD), bucket brigade devices (BBD) and other devices that have input portions to form charge packets and read out the analog or digital values of such charge packets, except photosensitive devices, which of course, in many instances do not require an input portion. The term CCD as used herein is meant to include both the surface channel and the bulk channel type of devices. The term "surface channel" is meant to include those devices where the charges move between a semiconductor body and the overlying dielectric. In the bulk channel type of CCD, the term includes those devices where the charges move within the semiconductor body. The term "bulk channel" (CCD) is meant to include both those that have a shallow channel and a deep channel that is, greater than 1 micron. In the shallow channel devices, those included the CCD's referred to as "buried channel or bulk channel." The deep channel (CCD) devices include the type known as Peristaltic devices. It is contemplated, that the devices in accordance with the present invention will provide simplicity in structure and operate equally as well regardless of the particular type of CTD. However, the description of the present invention includes the bulk channel type of CCD; and more particularly, the CCD known as the Peristaltic type, which demonstrates highspeed characteristics. It is understood that the particular geometric structure of the present invention is also advantageous in the construction of any type of CCD, BBD, or other type of CTD; and the various CTD's described herein may be fabricated in a conventional manner utilizing known diffusion, implantation, and epitaxial techniques.

Figure 1:
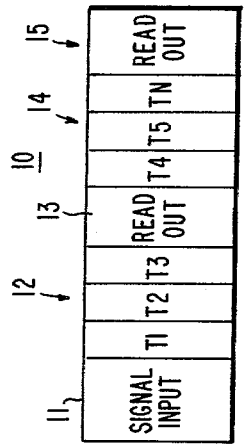
FIG. 1 is a block diagram illustrating the typical arrangement of the signal input, transfer gates, and readout structure which may be utilized in accordance with the present invention.

Referring to FIG. 1, a CCD generally referred to as 10, includes a signal input portion 11 for injecting and transforming the signal into a charge packet of a predetermined analog value; and also includes a charge transfer or shift register portion 12 which includes stages T1, T2, and T3 for storing and transferring such charge packet. The potential wells beneath gates referred to as G1, G2, and G3 (FIG. 3) are used to facilitate coupling between the transferring stage 12 and the input stage 11. A readout portion 13 is illustrated between the transferring stage T3 and stage T4 to illustrate the arrangement of the nondestructive readout portion 13. It is to be noted, that on the righthand side of the readout portion 13 as viewed in the drawing, there may be a transfer section 14 that continues to transfer the charge into subsequent transferring stages T4, T5, TN thereby utilizing non-destructive readout capabilities. Another readout portion 15 which is similar to that readout portion 13 may be provided adjacent the last transfer stage TN and may be utilized if desired as a destructive readout portion. As previously mentioned, it is understood that the FIG. 1 may represent any type of device in accordance with the present invention that includes a signal input portion and a charge transfer portion; or the signal input portion, the transfer portion, and the readout portion or different combination of these to form a structure with several input and output portions.

Figure 3:
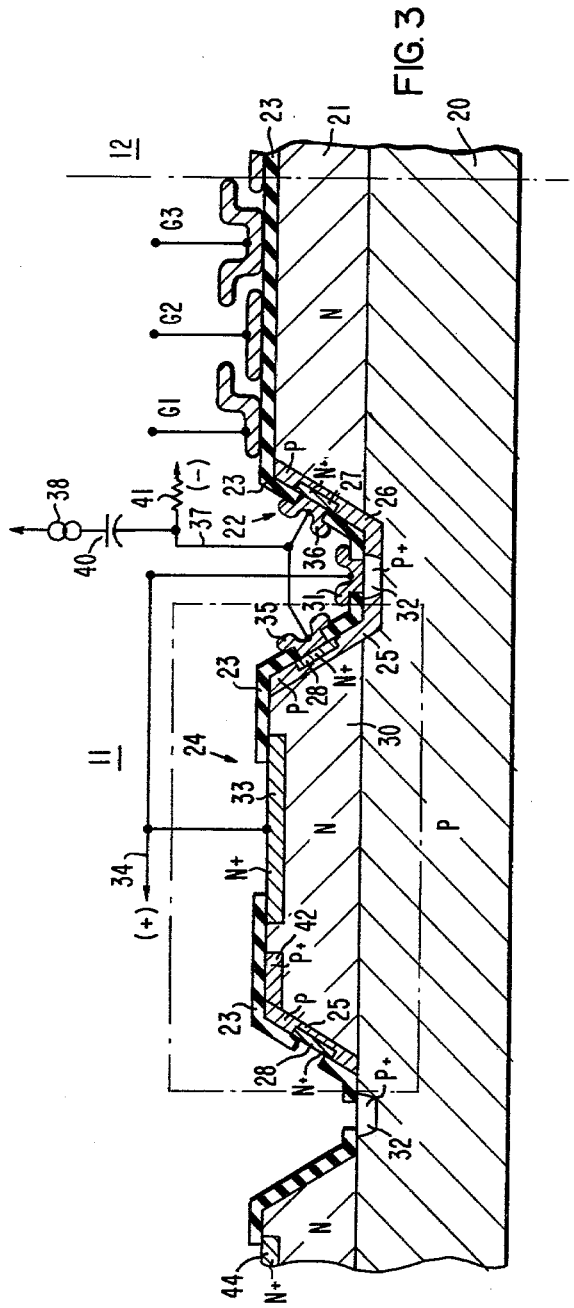
FIG. 3 is a sectional view taken at line III—III of FIG. 1 and looking in the direction of the arrows.
Figure 2:
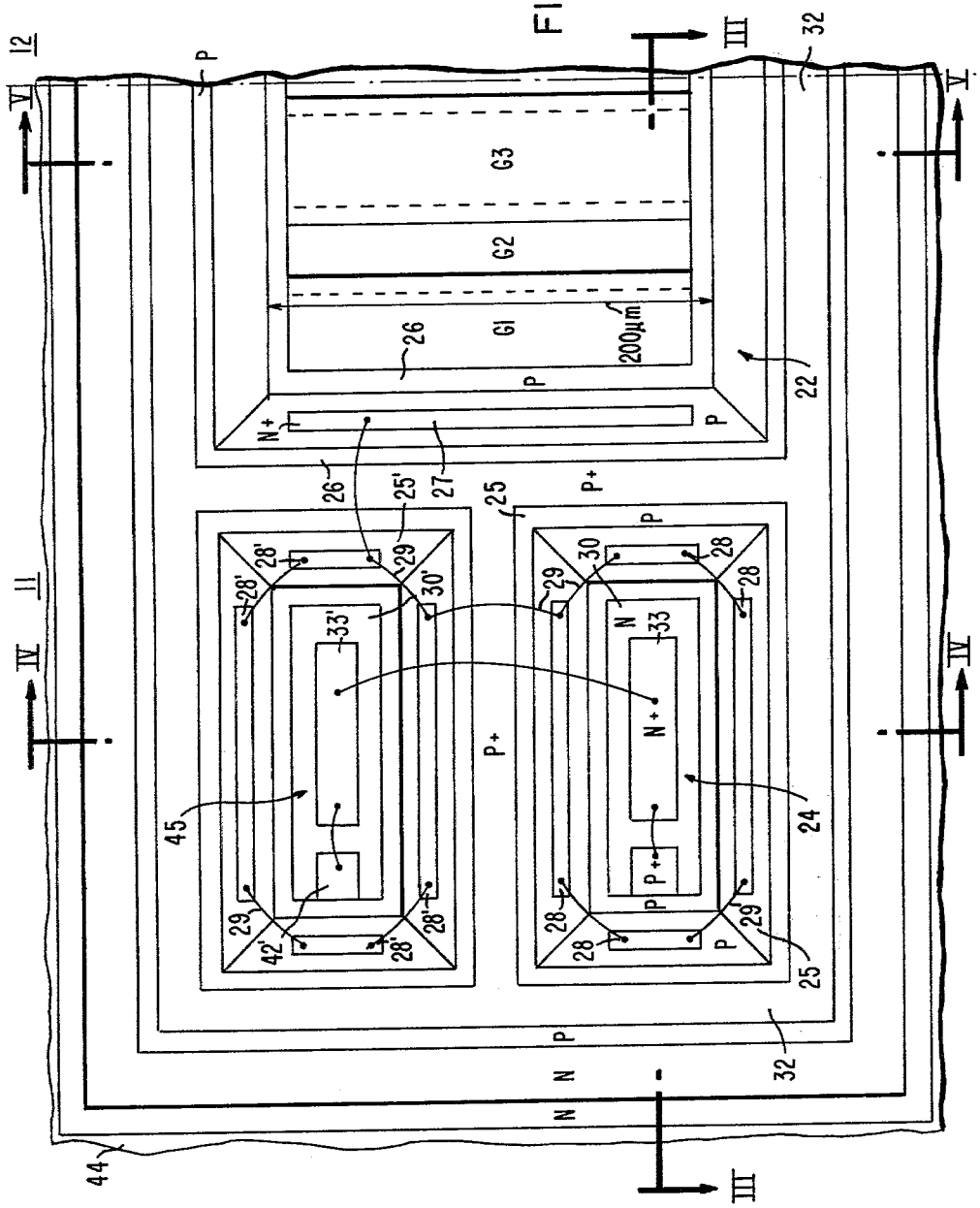
FIG. 2 is a fragmentary plan view of a charge coupled device to illustrate the input portion and the transfer portion in accordance with one embodiment of the present invention.

Referring to FIGS. 2 and 3, the portion 11 of FIG. 1 is shown in detail. For purposes of illustration and clarity, the dielectric and the metallic connections have been omitted from the plan view of FIG. 2. These figures represent the input and a portion of the transfer structure that is manufactured according to what is termed an anisotropic etch wherein the etching of the substrate occurs at different rates to provide a nonplanar surface. Substrate 20 may be formed of any semiconductive material such as silicon or gallium arsenide, for example and be in the neighborhood of 13 mils thick. In the substrate 20 is a channel portion 21 which is doped with an N-type impurity, and may be anywhere from one to five microns deep to form the potential well channels beneath gates G1, G2, and G3, as well as the collector portion for a first or sometimes called injection transistor 22. The width of the potential wells, for a high speed peristaltic CCD may be in the order of 200 microns, for example. (See FIG. 2). For a buried channel CTD such doping with the N-type impurity may be constant or uniform throughout. However, for a Peristaltic type device, the doping may not be constant, but graded, and the density of the impurities increases towards the surface adjacent dielectric portion 23. A second transistor 24 which may be termed a partitioning transistor has a base 25 formed from a P-type impurity which is also common with a base portion 26 for the first transistor 22. The base 25 and 26 regions may be one to two microns thick for high speed operation. The transistors 22 and 24 each have an emitter portion 27 and 28 which may be approximately four microns wide and connected to each other by wires 29 as shown in FIG. 2. The collector portion of the first transistor 22 is in common with the channel portion 21; and the partitioning or mirror transistor 24 has a collector portion 30 formed of an N-type impurity which may be one to five microns thick, for example. In order to make ohmic contact with the metallic portion 31 in contact with the base material, a P+ region 32 is formed beneath the contact 31. Similarly, the collector portion 30 of the transistor 24 has an N+ portion 33 for ohmic contact with the connection 34. Emitter contacts 35 and 36 of the transistors 22 and 24 are connected by a line 37 to an AC signal source 38 through a capacitor 40 and to a DC source through resistor 41. The common base terminal 31 for the transistors 22 and 24 is connected to the collector 30 of the transistor 24 through line 34 to a DC potential that is more positive than the DC potential applied to the emitter terminals 35 and 36. A typical current that may be applied to the DC source through the resistor 41 may be 2 milliamps, for example. A doped region with a P-type impurity referred to at 42 is in contact with the common base portion 25 and serves to short the base to the collector portion of the transistor 24, which ensures that the base-emitter junction potential is generated by the current flowing through the partitioning transistor and is identical in both the such transistors 22 and 24. A leakage ring 44 formed of N+ doped material is formed to reduce the leakage current into the CTD wells from the periphery of the entire CTD device.

The area of the emitter base junction of the transistor 22 is in a certain ratio to the area of the emitter base junction of the transistor 24. The current which is injected into the emitter contact at 37 is divided between the transistor 22 and 24 in accordance with the proportionate based emitted junction areas of the first transistor and one or more of the second transistors. In the event, that a large ratio is desired, that is, that the area of the emitter base junction of the partitioning transistors is substantially greater than a base emitter junction of the transistor 22, another partitioning transistor 45 (see FIG. 2) may be formed to provide the additional area. This transistor is similarly configured to the transistor 24 and includes emitter portion 28', base portion 25' in common with the base portion 26 of the transistor 22, a collector portion 30' and a portion 33' that is shorted to a P+ region 42 similar to the transistor 24. The emitter, base, and collector regions of the transistor 45 are connected to the emitter, base, and collector regions, respectively, of the transistor 24 which in effect increases the base emitter junction area thereby increasing the ratio between the second or partitioning transistors and the first or injection transistor. Although the plan view of the FIG. 2 illustrates two of the second or partition transistors 24 and 40, it is understood that only one of such transistors may be utilized or more than two may be utilized depending upon the desired ratio of the emitter base junctions to effect the proper fractional division of the input signal.

Figure 4:
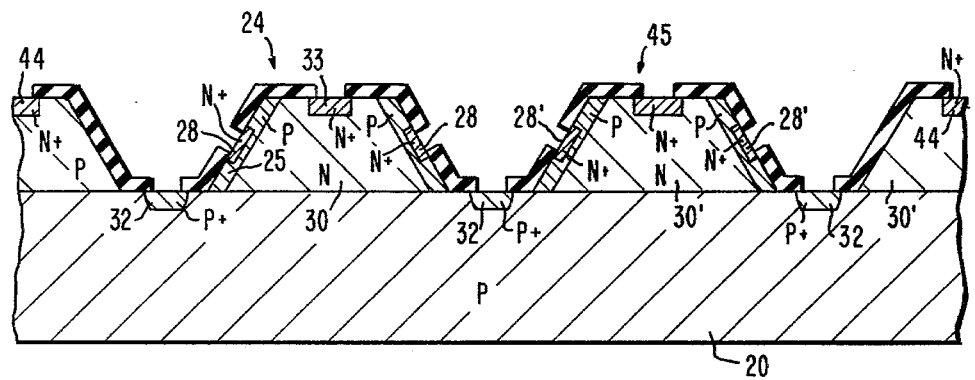
FIG. 4 is a sectional view taken at lines IV—IV of FIG. 1.
Figure 5:
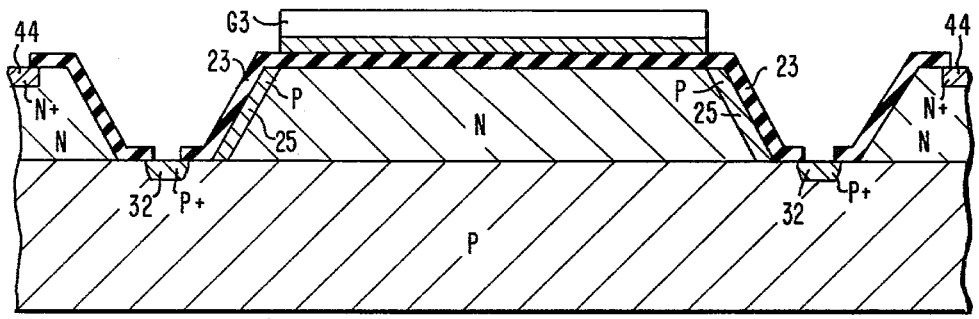
FIG. 5 is a sectional view taken at lines V—V of FIG. 1 and looking in the direction of the arrows.

Referring to FIGS. 4 and 5, which illustrate cross-sectional views as previously indicated and bear similar reference numerals, FIG. 4 illustrates also the isolation or channel stop 44 at opposite ends of each of the potential wells beneath the gates G1, G2 or G3 in order to confine the potential wells within the channel area provided. The gates G or the gates for the transfer stages T (FIG. 1) may be one micron thick, for example. The dielectric portion 23 (also FIG. 3) may be 0.1 of a micron thick, for example.

Figure 6:
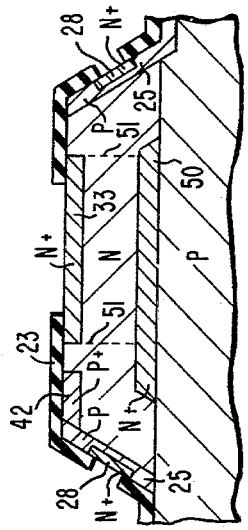
FIG. 6 is a fragmentary view of an alternate embodiment channel in which the potential well or wells resides is the virtual collector of such input structure.

Referring to FIG. 6, a fragmentary view of the second or partitioning transistor 24 is illustrated and corresponds to that portion of the input device within the dashed lines of FIG. 3. If desired, the transistor 24 may have a buried collector portion 50 doped with N+ impurities overlying the surface of the P substrate 20. Such buried collector is disposed beneath the N+ collector portion 33 and may be forty microns wide, for example, as viewed in FIG. 6; and if desired, may be extended in depth to merge with the N+ portion 33 as noted by the dashed lines 51. This arrangement of FIG. 6 decreases the collector resistance and improves the frequency response.

Figure 7:
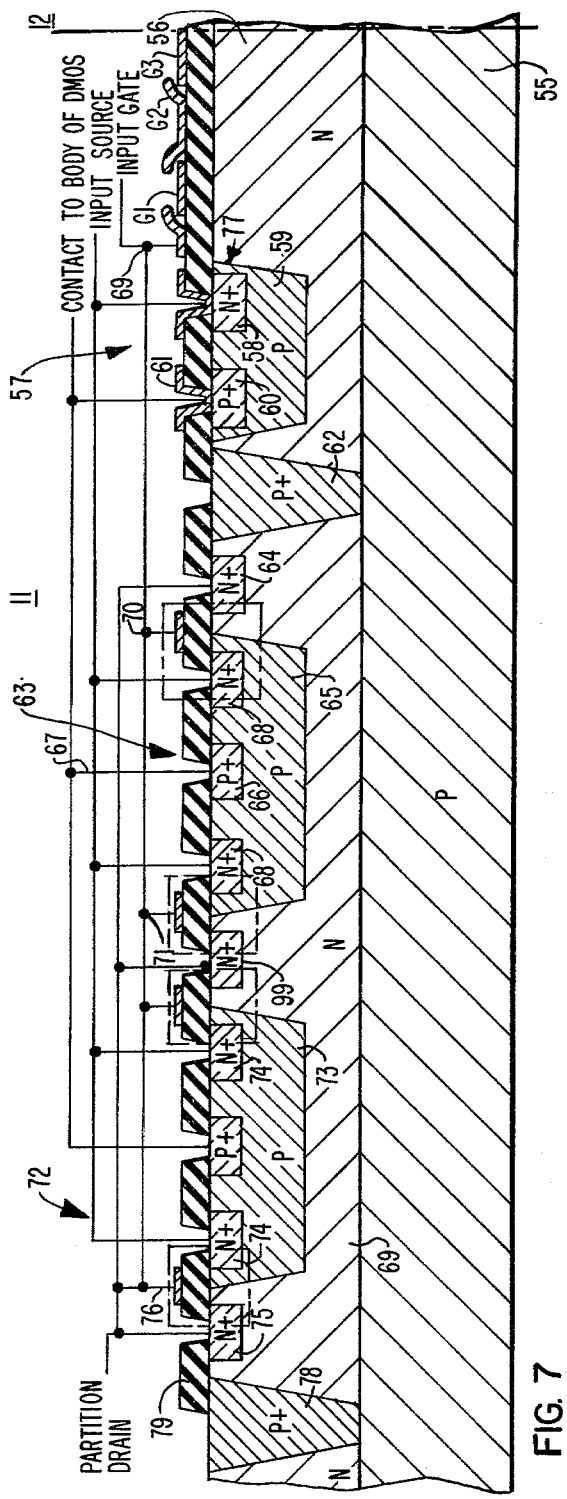
FIG. 7 is a sectional view similar to that shown in FIG. 2 except that it is constructed on a planar base surface with MOS type devices and illustrates in detail a typical connection of the various input transistors for typical operation.

FIG. 7, is essentially the same device as described in connection with FIGS. 1 through 6, except that it is fabricated in a planar sense. In this embodiment as in the previously described embodiments the device has a semiconductor base which may be silicon or gallium arsenide that is doped with a P-type impurity and referred to at 55, the potential well channel region is doped with an N-type impurity and referred to as 56. Within the channel, is a first MOS transistor 57 that has a source of N+ type impurity 58 and a body 59 of a P-type impurity. The body 59 has a P+ impurity diffusion region 60 for facilitating ohmic contact with its metallic connector 61. A P+ impurity portion 62 is utilized for isolating the transistor 57 from a partitioning transistor 63. The transistors 57 and 63 may be MOS transistors that are known conventionally as double diffused MOS transistors where more than one dopant is diffused in the same region. The partitioning transistor 63 has an input source of N+ impurity 68 and body portion of P-type impurity 65. A P+ impurity 66 is utilized to make ohmic contact with a line 67. The transistor 63 also has a drain portion of N+ impurity 64 which constitutes the drain of such transistor. Each of the transistors has a gate portion that are commonly connected similar to the common base portion of the previously described bipolar transistors. The gate node for the transistor 57 is referred to at 69 while the gate nodes for the transistor 68 are referred to at 70. Both of the gate nodes are tied together similar to the bases in connection with the description of FIGS. 1 through 5 to form a single node similar to the bipolar embodiment. Similarly, all of the sources of the transistors 57 and 63 which serve the same function as the emitters described in connection with the previous embodiment, the drain of the transistor 57 is in common with the channel portion 56 similar to the previous embodiment, while the drain portions of the transistor 63 are connected and in turn tied to gate portion 71, 70 of the transistor 63. The fractional division of the input current between the first transistor 57 and the second or partitioning transistor 63 is determined by the ratio of the width of the channels in the body of the first transistors 57 and the respective second transistors 63 and 72. The width of the channel is that dimension which is orthogonal to the plane of the surface of the drawing, or in other words goes through the paper. The length of the channel is that dimension between the source and drain of each respective transistor. Although the bottom of the P-type body 59, 65 of the transisors 57, 63 are shown spaced from the P-type base 55 in the N channel 56, the operation of the device does not appear to be adversely effected if such body 59 or 65 were extended to actual contact with the P portion of the base 55. The dimensions of the various layers may be similar to those described in connection with FIGS. 2 through 5.

Similar to the embodiment described in connection with FIGS. 2 through 6, another partitioning transistors such as 72 may be utilized to obtain a greater ratio of transistor channel width in order to direct a smaller fractional portion of the input current into the potential well. This transistor 72 has a body portion of P-type impurity 73, a source of N+ impurity 74, and a drain portion 99 which is in common with the drain portion 64 of the transistor 63, and is an only contact through an N+ impurity 75. The transistor 72 has a gate portion 76 which is tied to the gate portions of all the other transistors 57 and 63 and to the drain portions 64, 99 and 75 through the N+ impurity regions 64', 75 and 99 of the partitioning transistors 63 and 72. The width of the body portion 59 of the transistor 57 adjacent the potential well beneath the gate G1, which is narrow relative to the other dimensions and referred to as that dimension between arrows 77 in order that the charge will travel in a rapid manner toward the potential well beneath the gate G1. P+ portion 78 is an isolation region and crosshatched portions 79 and 62 represents insulation overlaying the body of the device with appropriate windows for connection thereto. It is understood that although FIG. 7 shows a planar type of construction with an MOS transistor configuration for the input structure in accordance with one embodiment of the present invention, it is understood, that such planar fabrication may be utilized with the bipolar transistor embodiment described in connection with FIGS. 2 through 6. Although FIG. 7 illustrates the input structure with double diffused MOS transistor, however, conventional MOS transistors can also be used.

Figure 8:
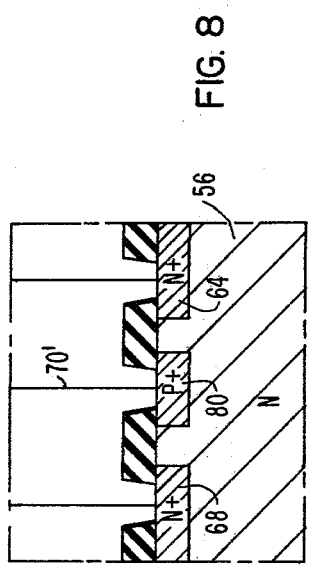
FIG. 8 is a fragmentary view within the dashed lines of FIG. 7 to show still another embodiment of the present invention for such portion and all others similar thereto.

Referring to FIG. 8, a fragmentary representation of that portion of the device within the alternately long and short dashed lines of FIG. 7 may be replaced with junction type field effect transistors. In this modification, the only difference is that the MOS gate portions such as 70 of FIG. 7 is in direct junction contact with a P+ impurity region 80; such gate portion being referred to as 70' in FIG. 8. The N+ regions referred to at 68 and 64 are merely representative of the N+ nodes within the other dashed lines of FIG. 7.

The incorporation of the partitioning transistor or transistors of the FIGS. 2 through 6, and 7 and 8 into the input structure overcomes the problem of interfacing such input structure with the external current sources. The relationship between the current in one or more of the second partitioning transistors, depending on how many are utilized, to the current in the first or injection transistor, is proportional to the base emitter junction areas of such transistors in the case of bipolar and the width of the channel in the case of the MOS as previously mentioned because the base emitter or gate source voltages are equal for both the first and second transistors. The common base lateral transistor and its partitioning transistor or in the case of MOS transistors the common gate may be fabricated by employing double diffused techniques as previously mentioned to obtain the very narrow base width of less than 1 micron. The base width 77 as mentioned in connection with FIG. 7 will be smallest next to the virtual collector (bi-polar) or drain portion (MOS) producing a condition where the current injected into the emitter or source will preferably enter the collector or drain portion by way of the narrow base region 77. A bias on the first gate G1 produces a virtual collector thereby achieving an input structure where the collector of the bipolar transistor or the drain of a MOS is part of the potential well channel. Such a configuration results in a higher injection speed because the transport time of charge across the collector or drain is eliminated by making such collector or drain, the first CTD potential holding well. The gate G2, and/or G3 may be used as an injection gate or can be connected to one of the potential well transfer or shift register clocks with a two phase or a one and a half phase clocking format as is well known in the art. The amount of charge injected into the virtual collector's holding well depends on the value of the input current that is directed into such well and the integration or clock well time. It is preferred to apply the input signal by applying a dc voltage via the resistor 41 to the emitter nodes and a modulating ac current signal through capacitor 40 as described in connection with FIGS. 2 and 3. The injected current is then divided between the first transistor and one or more of the second or partitioning transistors. The precise current division that takes place achieves two principal advantages; namely, reduction of the deleterious bandwidth effects caused by parasitic capacitance and reduction of the coupling difficulty between the CTD and an input signal source. Since the input structure acts as a current divider; a low input current into the charge transfer device can be maintained even though a higher input current is injected by applying a higher input signal through a smaller series impedance, thereby achieving a wider input bandwidth. Typically, base emitter junction area (for the bipolar transistor embodiment) can be made smaller than 100 $\mu$m by 4 $\mu$m, while the junction area of the partitioning transistor or transistors can be made 400 $\mu$m by 16 $\mu$m, resulting in a current attenuation of 16:1. The effect of the partitioning transistor or transistors is to reduce the input impedance at the emitter node and reduce the effect of parasitic capacitances. Hence, for a 1 kilohm series resistor with a parasitic capacitance less than 1.5 picofarads, a 100 megahertz input bandwidth, an input signal levels less than 260 millivolts can be achieved.

Although, in accordance with the present invention, it is contemplated that the input portion of the CTD may be comprised solely of the first bipolar transistor with its collector or drain forming a part of the channel of the first potential well, the utilization of the partitioning transistor or transistors as previously described makes possible for a wider signal input bandwidth as compared to the input structure with just the single bipolar transistor. For example, if the operating speed for a common base bipolar transistor with the partitioning transistor according to the present invention is calculated, such operating speed is determined by three regions; namely, the emitter frequency response, the base transit time and the collector transit time. The emitter frequency response represents the speed with which the emitter base voltage can change to accommodate a changing input current signal.

A simple expression for the emitter frequency response ($f_e$) is the input transconductance ($g_m$) divided by the total capacitance ($C_T$) at the emitter node times $2\pi$, i.e., $f_c = g_m/2\pi C_T$. Capacitance $C_T$ is the sum of: the emitter-base junction capacitance of the bipolar input transistor ($C_B$) and its mirror or partition ($C_M$) and parasitic capacitance $C_P$. It should be noted that capacitance $C_M$ and $C_B$ are proportional to each other (as the currents flowing respectively through the partitioning transistor and the bipolar input transistor) by the emitter-base junction areas. Without loss of generality assume a proportionality constant determined by the ratio of the junction area to be 25. Hence, the CCD input current $I_{CCD}$ will be 25 times smaller than the partition current $I_M$. Substituting for $g_m$ and $C_T$ we obtain the following expression:

$$f_e = \frac{eI_{CCD}}{2\pi kTC_B} \frac{1 + I_M/I_{CCD}}{\frac{C_P}{C_B} + \frac{C_M}{C_B} + 1} = \frac{eI_{CCD}}{2\pi kT} \frac{1}{C_B + \frac{C_P}{26}}$$

Clearly, the effect of the parasitic capacitance ($C_P$) on the input bandwidth at the emitter node is reduced twenty-six fold, a number equal to the current division of the input signal by the bipolar input structure. Hence, for a 10 $\mu$A CCD input current, an emitter area of 10 $\mu$m by 10 $\mu$m, base doped with $10^{16}$ Boron atoms/cm$^3$ and emitter concentration higher than $10^{18}$ Arsenic atoms/cm$^3$ we obtain for emitter frequency response $f_c = 1.14 \times 10^9$ Hz. The large frequency response is due primarily to a twenty-six fold reduction of the parasitic capacitance. If the parasitic capacitance were not reduced, the emitter operating frequency response would be equal to $1.53 \times 10^8$ Hz. Therefore, the equivalent transit time for the emitter region is $0.88 \times 10^{-9}$ sec. Using the diffusion equation, we calculate the base transit time, $t_B = 2W^2/2.43D_B$, for a 1 $\mu$m wide base (W) and 21 cm$^2$/sec for the diffusion constant ($D_B$), we obtain a $1.25 \times 10^{-9}$ sec transit time across the base. Continuing the calculation for the transit time across a 5 $\mu$m virtual collector, $t_c = \pi L_C/v_s$, we obtain $2.6 \times 10^{-10}$ sec as the minimum time required to transport electrons across the collector, with a saturation velocity of $6 \times 10^6$ cm/sec for electrons. Summing all the transit times (emitter, base and collector) we obtain a 418 MHz input frequency response for the bipolar partition input circuit. Clearly, the input signal injection frequency limitation is greater than 100 MHz and is limited by the series input resistor and its shunting capacitor. With additional care, the 1.5 pf capacitor shunting the input resistor can be reduced thereby, achieving further improvements in the CTD injection bandwidth.

Although there are various types of semiconductor material, the dopants are specifically shown for particular polarity, it is understood that such polarities may be reversed.

I claim:
1. A charge transfer device, comprising:
   a body of semiconductor material of one type of conductivity with an elongated channel and a plu- rality of gate electrodes overlying said channel for storing and transferring individual charge packets at predetermined positions along said channel;

a signal input portion including an injection transistor and at least one partitioning transistor adjacent said channel and being an integral part of said device for creating an individual charge packet in one of said predetermined positions in response to an injected electrical signal;

said injection and partitioning transistors being structured relative to each other to cause a charge packet to be directed into said channel having a magnitude representative of a predetermined fraction of the magnitude of said electrical signal applied to said signal input portion.

2. A charge transfer device according to claim 1 wherein said injection transistor has an emitter, base, and collector, said collector being a portion of said elongated channel.

3. A charge transfer device according to claim 1 wherein the injection transistor has an emitter base junction of a predetermined area, and wherein the partitioning transistor has a base common with the base of said injection transistor and an emitter base junction of an area that is a predetermined size relative to the emitter base junction of the injection transistor, the emitter of the injection and partitioning transistor are commonly connected to receive an applied signal.

4. A charge transfer device for storing and transferring charge packets from one potential well to an adjacent potential well, comprising:

a body of one type of semiconductor material;

an elongated channel of another type of conductivity overlying said body to define a charge transfer channel;

a plurality of gate electrodes spaced along the charge transfer channel, each gate electrode defining a potential well for storing a charge packet in adjacent regions of the transfer channel;

a first bipolar transistor having a collector region constituting a portion of the transfer channel adjacent one of the potential wells, and a base region forming a PN junction with the portion of the channel region constituting the collector, and an emitter region spaced from the channel region forming a PN junction with the base region;

at least one second bipolar transistor having a base common with the base of the first bipolar transistor, a first collector disconnected from the second collector of the first-mentioned transistor, the emitter base junction area associated with the collector of the second transistor being a predetermined size relative to the base emitter junction area associated with the collector of the first transistor; and means to apply an electrical input signal to both said emitter regions, whereby the first transistor injects a predetermined fraction of said applied signal to the charge transfer channel in accordance with the relative areas of the base emitter junctions.

5. A device according to claim 4 further including control means for transferring at predetermined time intervals said charge packet out of said adjacent potential well to another potential well.

6. A device according to claim 4 wherein said body has at least one planar surface, and each said gate terminals and bipolar transistor are formed on said planar surface.

7. A device according to claim 4 wherein said body has at least two surfaces parallel to one another and interconnected by sloping surfaces.

8. A device according to claim 7 wherein one of said sloping surfaces includes the emitter of said first mentioned transistor.

9. A charge transfer device comprising a substrate of semi-conductor material with an elongated channel and a plurality of gate electrodes overlying said channel for storing and transferring individual charge packets at predetermined positions along said channel, having a signal input portion and at least one adjacent potential well for storing and transferring a charge packet having a predetermined value and having means for applying an electrical current having a first value to the input portion, said input portion comprising:

a first transistor for directing a predetermined fraction of the value of the applied input current to the potential well, and at least one second transistor for diverting the fractional value of the input current not directed to the potential well, the frequency characteristics of said first and second transistor being substantially constant relative to each other.

10. A device according to claim 9 wherein the first and second transistors have a common base region, said first transistor has a collector region common with the potential well, said first and second transistors have commonly connected emitter regions, and the area of the base emitter junction of said first and second transistors being a predetermined size relative to one another;

said means for applying the signal current being the commonly connected emitter regions; and said second transistor including a collector region disconnected from the potential well for diverting the fractional current not directed to the potential well.

11. A device according to claim 10 wherein the second transistor has P+ type conductivity overlying the substrate to decrease the ohmic resistance between the base of the transistor and the substrate.

12. A device according to claim 10 wherein the potential well is a material of one conductivity type, the base regions of the transistors are of opposite conductivity type, and said collector region of the second transistor being separated from the potential well by a region of more heavily doped semiconductor material of said opposite conductivity type.

13. A device according to claim 9 wherein the first and second transistors are field effect transistors having a source, gate, and drain.

14. A device according to claim 13 wherein the first and second transistors each include a distinct source region electrically connected to each other.

15. A device according to claim 13 wherein said first transistor and second transistor each comprise a channel portion between the respective source and drain, each of said channels having a selected width dimension that extends transverse to its respective source and drain, and means to apply an electrical input signal to the source regions, whereby the first transistor injects and the second transistor diverts said predetermined fraction of said applied signal in accordance with the ratio of the selected width dimensions.

16. A device according to claim 9 wherein the first and second transistor means are bipolar transistors.

17. A device according to claim 9 wherein the first and second transistors each include a distinct emitter region connected electrically to each other.

* * * * *